United States Patent [19]

Masuda et al.

[11] Patent Number: 6,032,282
[45] Date of Patent: Feb. 29, 2000

[54] TIMING EDGE FORMING CIRCUIT FOR IC TEST SYSTEM

[75] Inventors: Noriyuki Masuda, Ageo; Masatoshi Sato, Gyoda, both of Japan

[73] Assignee: Advantest Corp., Tokyo, Japan

[21] Appl. No.: 08/999,037

[22] Filed: Dec. 29, 1997

Related U.S. Application Data

[63] Continuation-in-part of application No. 08/529,313, Sep. 19, 1995, abandoned.

[30] Foreign Application Priority Data

Sep. 19, 1994 [JP] Japan .................................. 6-249904

[51] Int. Cl.[7] ........................................................ G06F 1/04
[52] U.S. Cl. ............................ 714/744; 714/738; 713/500
[58] Field of Search ......................................... 714/738, 744, 714/25, 27, 32, 34; 713/500, 503

[56] References Cited

U.S. PATENT DOCUMENTS

| | | | |
|---|---|---|---|
| 5,491,673 | 2/1996 | Okayasu | 368/120 |
| 5,528,186 | 6/1996 | Imamura | 327/266 |
| 5,592,659 | 1/1997 | Toyama et al. | 713/503 |
| 5,710,744 | 1/1998 | Suda | 368/120 |
| 5,903,745 | 5/1999 | Nakayama et al. | 713/500 |

*Primary Examiner*—Ly V. Hua
*Attorney, Agent, or Firm*—Muramatsu & Associates

[57] ABSTRACT

A timing edge forming circuit includes a pattern generator for generating address data, a rate signal and pattern data, a first logic delay circuit for generating first delay time data by the address data wherein the first delay time data includes a first multiple delay time which is an integer multiple of one cycle of the clock signal and a first fractional delay time which is smaller than one cycle of the clock signal, and for sending an enable signal in synchronism with the clock signal which is delayed by the first multiple delay time and the first fractional delay time, a logic delay control circuit for adding the first fractional delay time to skew data to form second delay time data, a second logic delay circuit for providing a second multiple delay time in the second delay time data which is an integer multiple of one cycle of the clock signal to the enable signal, and for producing a second fractional delay time which is smaller than one cycle of the clock signal, a variable delay circuits for providing a high resolution delay time to the delayed enable signal based on the second fractional delay time.

9 Claims, 10 Drawing Sheets

| A B | $\overline{O}$ |
|---|---|
| A > B | 0 |
| A = B | 0 |
| A < B | 1 |

| X | Y | Z | $\overline{OA}$ | $\overline{OB}$ | $\overline{OC}$ |
|---|---|---|---|---|---|
| 1 | 1 | 1 | 1 | 0 | 0 |
| 0 | 1 | 1 | 1 | 0 | 0 |
| 1 | 0 | 1 | 1 | 0 | 0 |
| 0 | 1 | 1 | 0 | 1 | 0 |
| 0 | 1 | 0 | 0 | 1 | 0 |
| 1 | 0 | 0 | 0 | 0 | 1 |
| 0 | 0 | 0 | 0 | 0 | 1 |

TIMING EDGE FORMING CIRCUIT FOR IC TEST SYSTEM

This is a continuation-in-part application of application Ser. No. 08/529,313 filed Sep. 18, 1995, which is now abandoned.

FIELD OF THE INVENTION

This invention relates to a timing edge forming circuit for a semiconductor IC test system, and more particularly, to a timing edge forming circuit to accurately produce timings of a rising edge and a falling edge of a test signal to be supplied to an IC device to be tested.

BACKGROUND OF THE INVENTION

In testing semiconductor IC devices by a semiconductor IC test system, such as a semiconductor memory, an IC device is placed on a test head of the IC test system. The IC test system supplies a test signal to the IC device under test wherein rising and falling edges of the test signal are controlled by a timing edge forming circuit. The IC test system has a large number of test signal paths (test channels) to supply test signals to corresponding input pins of the IC device under test.

An example of conventional timing edge forming circuits is shown in FIG. 4 wherein only one set of circuits is disclosed to be used for one test signal path of the IC test system. The timing edge forming circuit of FIG. 4 includes three identical timing generation circuits in parallel to form various timing edges of a test signal. The timing chart of FIG. 5 shows an example of timing edges for such a test signal which is further explained below.

One of the test procedures or test items in testing semiconductor IC devices by an IC test system is a test cycle in which device under test is tested by varying test cycles determined by a user. In such a test, a time interval for each test cycle is not fixed but has to be freely set through a test program. During this test cycle, a driver 51 provides a test signal, which is alternatively called a driver waveform, to the device under test. The driver waveform is wave-formatted to a desired waveform, such as a return to zero, a non-return to zero or an exclusive OR waveform by a wave formatter (not shown) before being applied to the device under test.

A relationship among the test cycle, the driver waveform and the timing edges is shown in FIG. 5. In each of the test cycles of FIG. 5, one or two driver waveforms for testing the IC device are produced having three timing edges which are delayed by t1, t2 and t3, respectively, from the starting edge of the test cycle. When generating one driver waveform, two timing edges, i,e., rising and falling edges, are necessary. Likewise, when generating two driver waveforms, four timing edges are necessary. In the case of FIG. 5, three driver waveforms are generated during two test cycles, a test cycle 1 and a test cycle 2. Therefore, three timing edges shown as timing edges t1, t2 and t3 are necessary for each test cycle to determine timings of the driver waveforms.

In general, one timing generation circuit is so structured to generate one timing edge in one test cycle. Thus, in a case where three timing edges are to be generated as in FIG. 5, three timing generation circuits are provided in a parallel form as shown in FIG. 4. The outputs of the timing generation circuits are combined by OR circuits $40_1$ and $40_2$, to provide set and reset signals to an RS flip-flop 50 for forming the driver waveforms generated by a driver 51.

In the following, description will be made as to the upper most timing generation circuit of FIG. 4. The timing generation circuit includes a timing generator 1, a format control gate $22_1$ in a format control 20 and a skew adjuster $30_1$ connected in series. A timing edge generated by this timing generation circuit provides either a set signal to the RS flip-flop 50 through the OR circuit $40_1$ or a reset signal to the RS flip-flop 50 through the OR circuit $40_2$. A pattern generator 5 generates address data which selects delay time data stored in the timing generator, a rate signal which is a basis of a test cycle, and a pattern data which shows a time difference between the test cycle and the rate signal. The rate signal, pattern data and the delay data define corresponding test cycles and timing edges of driver waveforms within the test cycles.

The timing generator 1 provides a timing edge ti having an delay time defined by the delay time data selected by the address data from the pattern generator 5 to the format control gate $22_1$. The timing generator 1 incudes a logic delay circuit 10, an enable gate 11 and a variable delay circuit 12. A reference clock signal CK is provided to the logic delay circuit 10 and the enable gate 11. The logic delay circuit 10 has a data memory M and a clock synchronous delay circuit in which a plurality of series connected flip-flops are driven by a high resolution clock signal CK. The clock synchronous delay circuit (not shown) generates an enable signal which is delayed from the rate signal provided by the pattern generator 5. The enable signal is arbitrarily delayed by an integer multiple of a time period of the clock signal in synchronism with the clock signal. The enable signal opens the enable gate 11 to pass therethrough in synchronism with the reference clock CK.

The frequency of the clock signal CK can be selected by a design choice such as 200 MHz which gives resolution of 5 ns since one period of the clock signal is 5 ns. However, the test cycle or the timing edges sometimes require higher resolution in time setting which is less than 5 ns, for example, 1 ns resolution is required. For example, time lengths of the test cycles may be 38 ns, 33 ns and 35 ns and delay times of the timing edges may be 14 ns, 14 ns and 12 ns, respectively, as shown in an example of FIG. 7.

In such a case, the variable delay circuit 12 is provided at the end of the enable gate 11 which provides an additional delay time which can be set by 1 ns increment, for example, under the control of high resolution delay data from the data memory M. The data memory M stores the high resolution delay data to control the variable delay circuit 12 when the test program requires timing resolution of less than the reference clock time period of 5 ns. The delay time based on the delay time signals from the data memory M can be changed in real time.

An example of circuit configuration for the variable delay circuit 12 is shown in FIG. 6. The example of FIG. 6 is configured by a plurality of IC gates each of which provides a delay time based on its signal propagation delay time. An input pulse signal is supplied to an input terminal 13 and delay time signals are supplied at an input terminal 14. The delay time signal is provide to AND gates $15_1$ and $15_2$ one of which is selectively opened. In case where the gate $15_1$ is selected, the input pulse signal is delayed by a delay circuit 16 which provides a delay time of 2ns and is supplied to an OR gate 17. When the gate $15_2$ is selected, the input pulse signal is supplied to the OR gate 17 without delay. In a similar manner, the input pulse signal is selectively coupled to circuits either with the delay or without the delay. Thus, the input pulse signal can freely acquire a ins delay time by a delay circuit 18 or a 500 picosecond (0.5 ns) delay time by a delay circuits 19. In the example of FIG. 6, the maximum of 4 ns delay time with 500 picosecond resolution is available.

In FIG. 4, a main format control 21 in the format control 20 receives the address data from the patten generator 5 and selects the format data therein to provide gate signals to the format control gates $22_1$, $22_2$ and $22_3$. In other words, an example of the main format control 21 is basically a memory which stores the format data to be supplied to the format control gates 22. In the format control gate 22, it is selected whether the enable signal from the timing generator 1 is to be used for forming a rising edge or a falling edge of the test signal. The selected enable signal is provided with an additional delay time by the skew adjuster 30 to adjust the skew between the plurality of signal paths and then supplied to the OR gates $40_1$ or $40_2$.

The skew within the context of this invention refers to differences of time in signal propagation delays among the plurality of signal paths relative to a reference time. In the example of FIG. 4, the timing edge forming circuit includes six signal paths toward the OR gates $40_1$ and $40_2$ to produce driver waveforms for one test channel. The time differences among the signal propagation delay in the signal paths from the reference time until the signals reaching the predetermined point such as the RS-flip-flop 50 is called a skew. The skew adjuster 30 adds delay times to each of the signal path so that all of the signal propagation times in the signal paths become the same. For example, the reference time is determined to be equal to the longest propagation time among the six signal paths.

Variable delay circuits 33 and 34 in the skew adjuster 30 have the same basic structure as used in the variable delay circuit 12 shown in FIG. 6. However, since the delay time required for adjusting the skew time in the variable delay circuits 33 and 34 is usually considerably larger than the delay time required for providing a high resolution delay time smaller than one cycle of the clock signal, the number of circuit components in the variable delay circuits 33 or 34 is considerably larger than that of the variable delay circuit 12 in the timing generator 1. Registers 31 and 32 are used to provide the delay time for the skew adjuster 33 and 34 since the delay time in the skew adjusters are fixed once adjusted.

FIG. 7 shows a timing chart of the operation of the timing edge forming circuit mentioned above. The test cycles of FIG. 7A and the delay times of the timing edges of FIG. 7E relative to the starting edges of the test cycles are determined by a user by means of a test program. In this example, the test cycle 1 is 38 ns and the delay time is 14 ns while the test cycle 2 is 33 ns and the corresponding delay time is 14 ns, which are written in the program. The frequency of the reference clock signal CK of FIG. 7B is 200 MHz and thus the time period thereof is 5 ns.

The rate signal which is synchronous with the reference clock CK as shown in FIG. 7C and the pattern data (PADAT) of FIG. 7D which shows time differences between the test cycles and the rate signals are provided to the logic delay circuit 10 from the pattern generator 5. By the address data from the pattern generator 5, the timing generator produces the delay data shown in FIG. 7E indicating the delay times of the timing edges of the driver waveforms (test signals) within the test cycles. Both the rate signal which is synchronous with the reference clock period 5 ns and the pattern data (PADAT) produce the above noted time length of each test cycle.

In the test cycle 1, the example of the delay time of the timing edge is 14 ns as shown in FIG. 7E. Thus, the logic delay circuit 10 sends an enable signal (FIG. 7F) having 5 ns pulse width and ions after the start of the test cycle 1 to the enable gate 11. The enable signal is synchronized with the clock signal CK in the enable gate 11 so that the output of the enable gate 11 which is a gated clock signal is produced after ions from the start of the test cycle 1. The variable delay circuit 12 provides a delay time of 4 ns to form a 14 ns timing edge as shown in FIG. 7I. The skew adjuster 30 adds a predetermined time to the signal from the from the variable delay circuit 12 via the format control gate 20 to compensate the propagation delay time differences among the other signal paths. In the example of FIG. 7J, a delay time of ions is automatically added to the gated clock signal from the variable delay circuit 12 to adjust the skew. The output of the skew adjuster 30 is supplied to the OR circuits $40_1$ or $40_2$.

The timing edges in the conventional semiconductor IC test system are formed as described above. As shown in FIG. 4, three identical timing circuits are used in parallel to generate timing edges, each circuit of which generates either a rising edge or a falling edge. Namely, the timing edges are generated by the timing generators 1–3, the format control gates 22, the skew adjusters 30 and applied to the RS flip-flop 50 via the OR gates through six signal paths. In FIG. 4, the six signal paths extend from the variable delay circuits 33 and 34 to the OR gates 40.

The timing edge forming circuit for producing high resolution timing edges are important to determine the ability of the semiconductor IC test system. However, the overall length of the signal paths, such as signal paths from the skew adjusters 30 to the OR gates 40, limit the possible resolution in the timing edges since the signal propagation times in the signal paths will change with environmental variations such as temperature changes.

As noted above, since the delay time required for adjusting the skew time in the variable delay circuits 33 and 34 is considerably larger than the delay time required for providing the high resolution delay time which is smaller than one cycle of the clock signal, the number of circuit components and the signal path length in the variable delay circuits 33 or 34 become considerably large. In addition, the variable delay circuits 33 and 34 produce delay times based on the signal propagation delay time in each IC gate which is not very stable since such propagation delay time is an analog time. Thus, the conventional timing edge forming circuit has a problem that it is difficult to produce high resolution timing edges.

Further, when the signal path is long, the timing edges are more affected by jitter in the signal paths, which also lowers the accuracy of the timing edges. Therefore, there is a need to reduce the overall length of the signal paths extending from the timing generator to the format control gate, the skew adjuster and the OR gate and to the RS flip-flop. It is also expected that shortening the signal path length will reduce the uncertainty of timing resolution involved in designing the timing circuits, which will ease a designing process in this kind of timing circuit.

Furthermore, the conventional timing edge forming circuit requires a large number of circuit components such as in the skew adjusters for establishing high resolution, which results in high cost. In addition, the conventional timing edge forming circuit made it difficult to simplify the design and adjustment of the circuits since a large number of analog hardware components are used which need special attention in terms of timing resolution.

SUMMARY OF THE INVENTION

Therefore, it is an object of the present invention to provide a timing edge forming circuit to be used in a semiconductor IC test system which is capable of improving timing accuracy and resolution in forming the timing edges of test signals to be applied to a semiconductor device under test.

It is another object of the present invention to provide a timing edge forming circuit which is capable of generating timing edges for producing test signals with high accuracy and resolution without being affected by environmental conditions such as temperature variations.

It is a further object of the present invention to provide a timing edge forming circuit which is capable of reducing the number of circuit components to form the timing edge forming circuit.

It is still a further object of the present invention to provide a timing edge forming circuit which is capable of reducing the number of signal paths for propagating the timing signals therethrough.

It is a further object of the present invention to provide a timing edge forming circuit which is capable of shortening the length of signal paths for propagating the timing signals therethrough.

According to the present invention, the timing edge forming circuit is so arranged that analog type circuits, such as high resolution variable delay circuits are significantly reduced and is replaced by logic type circuits. The number of signal paths and the length of the signal paths for propagating the timing signals are also reduced. The timing edge forming circuit of the present invention is used in a semiconductor IC test system for testing an IC device by supplying test signals through a plurality of test signal paths corresponding to input pins of the IC device to produce a plurality of timing edges of a test signal within a test cycle for each test signal path.

The timing edge forming circuit of the present invention includes:

a pattern generator (5) for generating test pattern information to produce a test signal to be supplied to the semiconductor device wherein the test pattern information includes address data, a rate signal and pattern data;

a plurality of first logic delay circuits (10) receiving the rate signal and the address data from the pattern generator wherein first delay time data is generated by a data memory accessed by the address data wherein the first delay time data includes a first multiple delay time which is an integer multiple of one cycle of the clock signal and a first fractional delay time which is smaller than one cycle of the clock signal, and each of the first logic delay circuit generates an enable signal in synchronism with the clock signal which is delayed by the first multiple delay time and the first fractional delay time;

a control gate for sending the enable signal from the first logic delay circuit either through a gate for forming a rising edge or a gate for forming a falling edge of the test signal;

a logic delay control circuit (70) for receiving the first fractional delay time from the first logic delay circuit wherein the logic delay control circuit stores skew data for adjusting a skew which is a difference in signal propagation delay times between the signal paths and adds the first fractional delay time and the skew data to form second delay time data;

a plurality of second logic delay circuits (80) receiving the second delay time data from the logic delay control circuit wherein each of the second logic delay circuits provides a second multiple delay time in the second delay time data which is an integer multiple of one cycle of the clock signal to the enable signal to form a delayed enable signal, and produces a second fractional delay time which is smaller than one cycle of the clock signal, and each of the second logic delay circuits transmits the delayed enable signal and the second fractional delay time; and a variable delay circuits (12) for providing a high resolution delay time to the delayed enable signal based on the second fractional delay time.

According to the present invention, the variable delay circuit needs to provide only a high resolution delay time which is smaller than a time period of one reference clock cycle while variable delay circuit in the conventional example has to provide a larger amount of delay time. This means that the high resolution delay time produced by the analog variable delay circuit utilizing signal propagation delay times has a smaller share in the timing edge forming circuit of the present invention than that in the conventional circuit. The large portion of the delay time in forming the timing edges are undertaken by the logic delay circuits wherein the delay time is formed in synchronism with the reference clock signal. The variable delay time in the timing edge forming circuit of the present invention is used to produce only a delay time smaller than the time period of one reference clock cycle.

Especially, the variable delay circuit used in the conventional timing circuit such as shown in FIG. 7 to provide a fairly large amount of delay time for adjusting the skews by an analog operation is obviated in the present invention. In the present invention, most of the delay times for adjusting the skews are produced by the logic delay circuit which is operated in synchronism with the clock signal. Further, since the large part of the variable delay circuit has been eliminated, a signal path length for propagating the timing pulses has been reduced.

Therefore, in the present invention it is possible to improve the resolution in setting the timing edges of the test signal since the delay time to be produced by the analog operation of the circuit components, i.e., the variable delay circuit is significantly reduced. Furthermore, since the signal path length has also been reduced, the timing accuracy and resolution as well as the timing stability have been improved. For example, the timing edges of the present invention is less affected by the environmental changes such as temperature variations. In addition, timing fluctuations caused for example by noise has been reduce to 20 picosecond in the present invention from 60 picosecond which is typical in the conventional circuit.

As noted above, the large portion of the variable delay circuit to be used to produce the delay time for adjusting the skew time has been eliminated in the present invention. The variable delay circuit in the present invention is used only for producing the high resolution delay time which is smaller than the time period of the one clock cycle. Since the delay time for adjusting the skew time is fairly larger than the time period of the clock signal, the variable delay circuit in the conventional timing circuit requires a large number of IC gates and selection gates. In the present invention, however, the circuit can be formed with less cost since the number of circuit components has been considerably reduced. Further, because the major portion of the timing edge forming circuits is formed with logic circuits, it has become practical to integrate the circuit into an integrated circuit such as an LSI.

DETAILED DESCRIPTION OF THE PREFERRED EMBODIMENT

Figure 1:
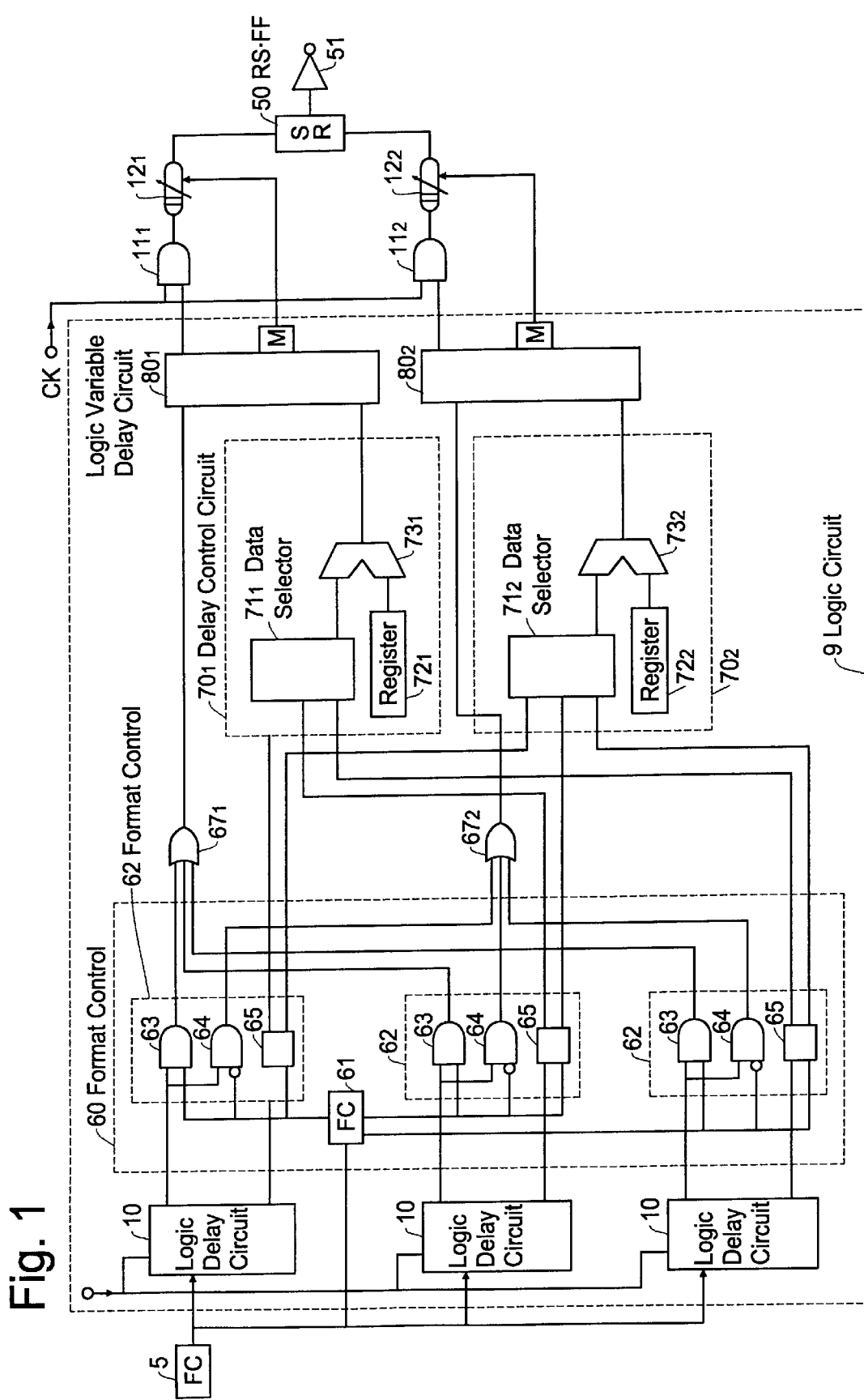
FIG. 1 is a block diagram showing an embodiment of the timing edge forming circuit of the present invention to be used in a semiconductor IC test system.
Figure 2:
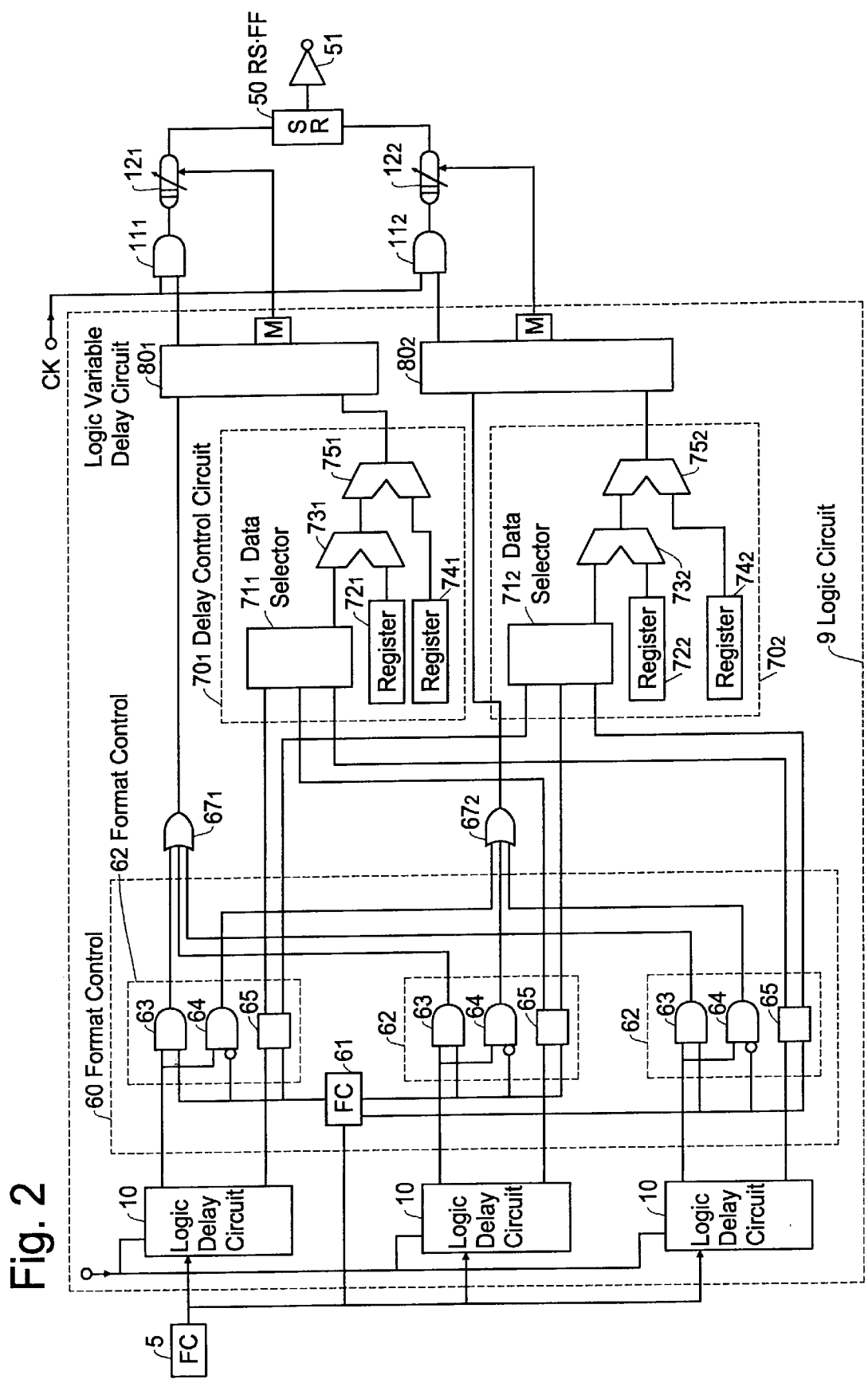
FIG. 2 is a block diagram showing another embodiment of the timing edge forming circuit of the present invention.

FIG. 1 is a block diagram showing a first embodiment of the timing edge forming circuit of the present invention. FIG. 2 shows a second embodiment of the present invention. In FIGS. 1 and 2, the same reference numerals as used in FIGS. 4 and 7 denote the corresponding circuit components and signals.

Figure 4:
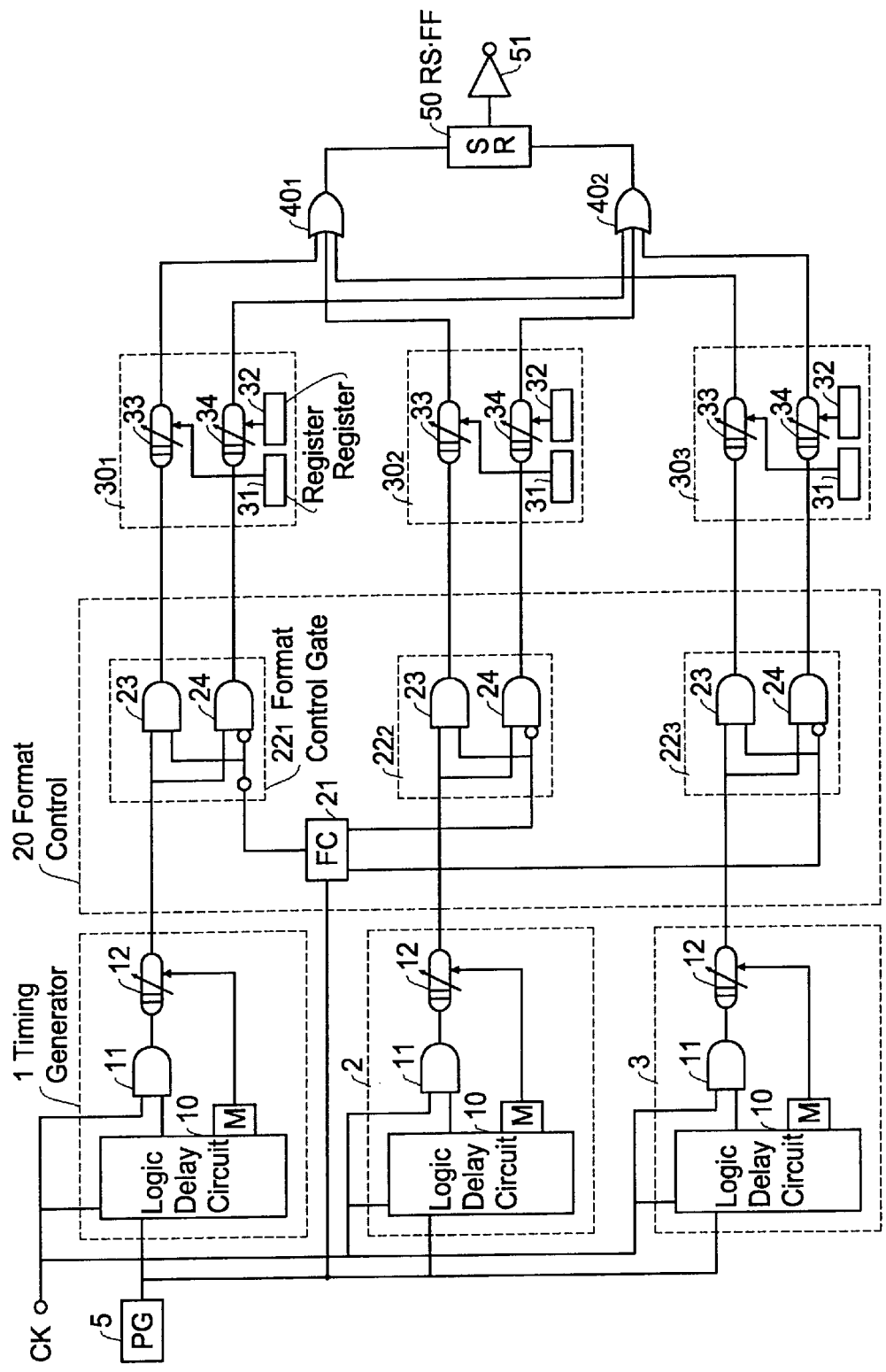
FIG. 4 is a block diagram showing an example of a timing edge forming circuit used in a semiconductor test system of conventional technology.
Figure 5:
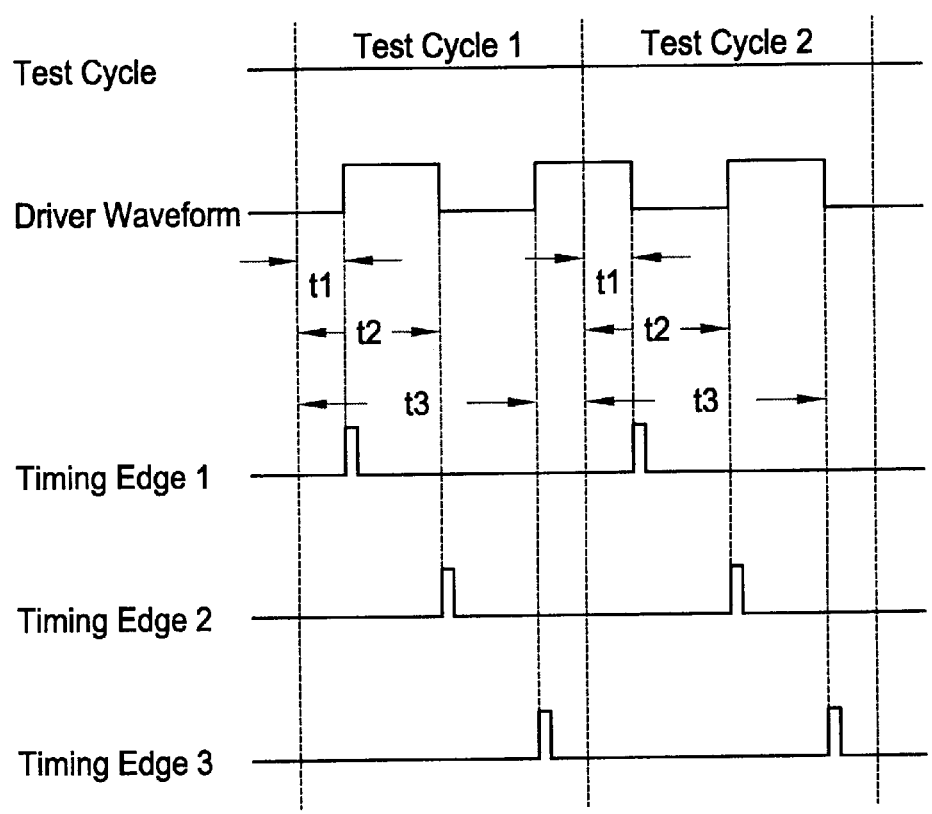
FIG. 5 is a schematic diagram explaining relationships between driver waveforms and timing edges with respect to test cycles.
Figure 6:
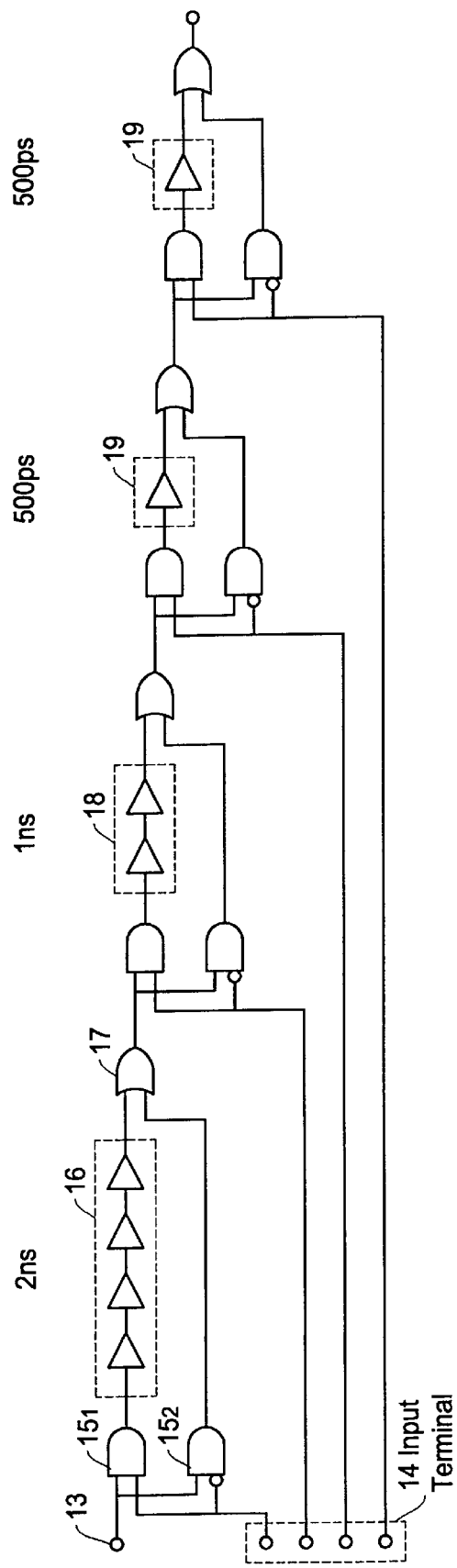
FIG. 6 is a circuit diagram showing an example of variable delay circuit.

In FIG. 1, the timing generator 1 of FIG. 4 is separated into two, a logic circuit part 9 and a high resolution timing part including variable delay circuits 12, so that enable gates 11 and the variable delay circuits 12 are positioned immediately prior to the RS flip-flop 50. The logic delay circuit 10 receives the address data, pattern data, and rate signals from the pattern generator 5 in the same way as in FIG. 4. The skew adjuster 30 shown in FIG. 4 are no longer used in the example of FIG. 1. A logic delay control circuit 70 and a logic variable delay circuit 80 are newly employed. The structure of the format control 60 is basically the same as the format control 20 of FIG. 4. However, the format control 60 is positioned immediately after the logic delay circuit 10 so that it receives enable signals which is a signal delayed by a integer multiple of the reference clock signal CK.

In the example of FIG. 1, three logic delay circuits 10 receive the data from the pattern generator and a main format control 61 in the format control 60 receives address data from the pattern generator 5. The logic delay circuits 10 provide delay times the resolution of which is equal to one cycle of the reference clock signal CK by utilizing a clock synchronous delay circuit (not shown) or a down counter (shown in FIG. 8). The outputs of the logic delay circuits 10 are supplied to the logic variable delay circuits $80_1$ or $80_2$ through format control gates 62 and OR gates $67_1$ or $67_2$. The delayed signal from the logic delay circuit 10 is selected by either one of the gates 63 and 64 in the format control gate 62 to be supplied to either the OR gate $67_1$ or $67_2$. The selection of the gates 63 and 64 is accomplished by the main format control 61 based on the information included address data from the pattern generator 5.

The OR gate $67_1$ and the logic variable delay circuit $80_1$ deal with timings of the rising edges of the test signals (driver waveforms) while the OR gate $67_2$ and the logic variable delay circuit $80_2$ deal with timings of the falling edges of the test signals. Reference numerals 67 and 80 may also be used hereinafter in case where there is no need to distinguish between the rising and falling edges.

When the timing resolution required for producing the test signal is smaller than the time period of the clock signal CK, a delay data memory in the logic delay circuit 10 addressed by the address data from the pattern generator 5 provides high resolution delay data to a signal selector 65. The signal selector 65 selects, based on the control from the main format control 61, whether the delay data from the logic delay circuit 10 is supplied to the logic delay control circuit $70_1$ to produce timings for rising edges or the logic delay control circuit $70_2$ to produce timings for falling edges. The signal selector 65 may be formed of two signal multiplexers.

The logic delay control circuit 70 includes a small data selector 71, a register 72 and an accumulator 73. The small delay data selector 71 receives the high resolution delay data from the signal selector 65. An example of circuit configuration of the small data selector 71 is shown in FIG. 10. In the example of FIG. 1, the small data selector 71 receives such delay data from three logic delay circuits 10 and selects the smallest data, i.e., the data showing the shortest delay time. The smallest time data is added with data from the register 72 at the accumulator 73 and transmitted to the logic variable delay circuit 80. The register 72 stores the data for adjusting a skew time of a corresponding signal path. Since only two high resolution signal paths are used in this example, the skew data in either one of the registers $72_1$ or $72_2$ can be zero.

The logic variable delay circuit 80 distinguishes whether the data from the logic delay control circuit 70 indicates the delay resolution smaller than the time period of the clock signal CK or the larger than the time period of the clock signal CK. If the data requires the delay time larger than the reference clock period, the logic variable delay circuit 80 provides a delay time produced by a delay counter (FIG. 9) to the enable signal from the OR gate 67. The delay time in this situation is an integer multiple of the time period of the clock signal CK. The delayed enable signal is then supplied to an enable gate 11. If the data from the logic delay control circuit 70 requires the delay time smaller than the one clock cycle, i.e., high resolution, such data is processed in the variable logic delay circuit 80 and the resultant data is provided to the high resolution variable delay time 12.

At the enable gate 11l which is for producing the rising edge timings, the enable signal from the logic delay circuit $80_1$ opens the enable gate $11_1$ so that the clock signal CK controlled (gated) by the enable signal passes therethrough. The clock signal from the enable gate $11_1$ is added with a delay time which is smaller than the one cycle period of the clock signal CK by the variable delay circuit $12_1$ to form a rising timing edge to be supplied to the RS flip-flop 50 as a set signal.

Similarly, at the enable gate $11_2$ which is for producing the falling edge timings, the enable signal from the logic delay circuit $80_2$ opens the enable gate $11_2$ so that the clock signal CK controlled by the enable signal passes therethrough. The clock signal from the enable gate $11_2$ is added with a delay time which is smaller than one clock cycle of the clock signal CK by the variable delay circuit $12_2$ to form a rising timing edge to be supplied to the RS flip-flop 50 as a reset signal.

FIG. 2 shows another embodiment of timing edge forming circuit of the present invention. In FIG. 2, the logic delay control circuit 70 further includes a register 74 and an accumulator 75 for additionally providing an offset time to the timing edge formed by the timing circuit of FIG. 1. In semiconductor IC testing, such an offset time is sometimes necessary, for example to synchronize the driver waveform with an expected pattern generated by the pattern generator to be supplied to a logic comparator which compares an output signal from a device under test which is provided with the driver waveform with the expected pattern. Such an offset time may be a positive time (to be added to the timing edge) but may also be a negative time (to be subtracted from the timing edge).

In FIG. 2, the register 74 stores the offset time data, and when providing the offset time to the timing edge, the data from the register 74 is added to the timing data by the accumulator 75. Whether the offset time should be added to the timing edge or not is determined by the user of the test system through the program. When the program requires the offset time, a central processor (not shown) of the test system provides the offset time to the register 74 to be stored therein.

In the examples of FIGS. 1 and 2, the accumulators 73 and 75 in the logic delay control circuit 70 must operate in real time with high speed, since the operations by the accumulators should not be delayed from the enable signal from the logic delay circuit 10 to the logic variable delay circuit 80 through the OR gate 67. Therefore, to give a sufficient time of operation in the accumulators 73 and 75, additional delay elements may be provided between, for example the OR gate and the variable logic delay circuit 80.

Figure 3:
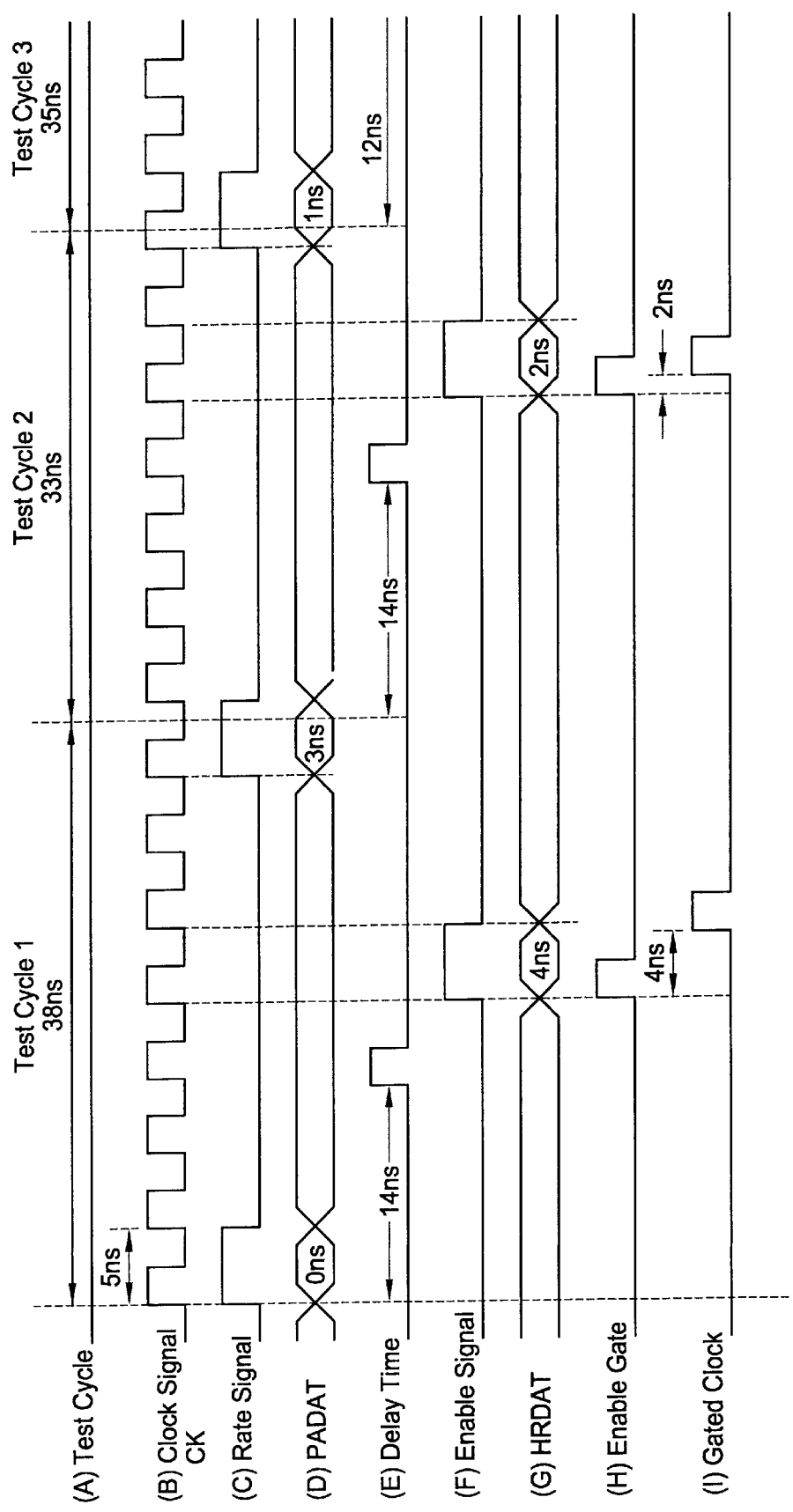
FIG. 3 is a timing chart showing operations of the embodiments of FIGS. 1 and 2.
Figure 7:
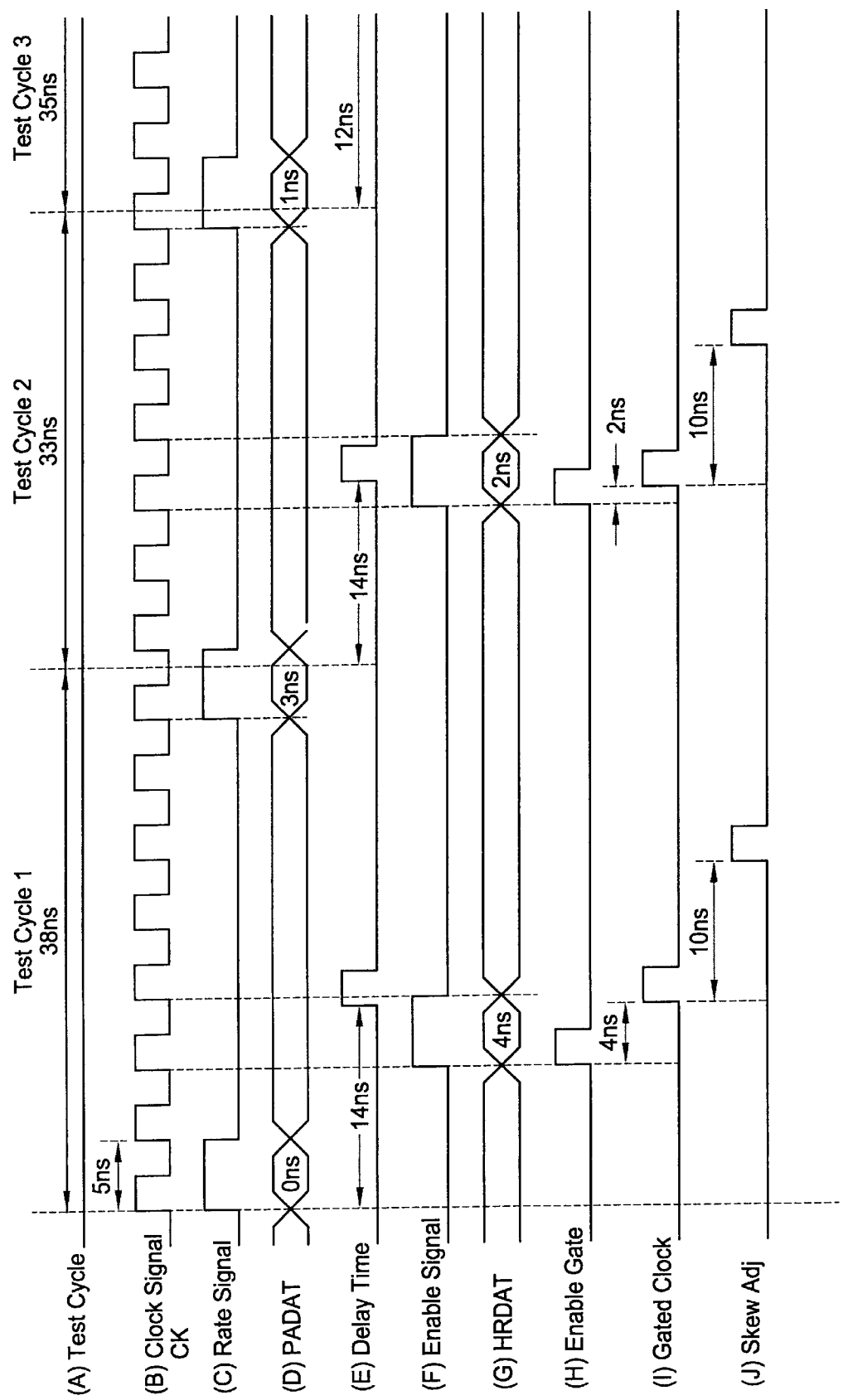
FIG. 7 is a timing chart showing an operation of the conventional timing edge forming circuit of FIG. 4.

A timing chart showing the operation of the timing edge forming circuit of the present invention is shown in FIG. 3 wherein the conditions, the test cycle, the timing edge, etc. are the same as that of FIG. 7. For example, the test cycle 1 is 38 ns and the delay time for generating a timing edge is 14ns while the test cycle 2 is 33 ns and the corresponding delay time is 14 ns, all of which are written in the program by a user prior to the test. The test cycles of FIG. 3A, the reference clock signal whose frequency is 200 MHz shown in FIG. 3B, and the rate signal from the pattern generator 5 shown in FIG. 3C are identical to those of FIG. 7. Further, the pattern data (PADAT) showing the time difference between the test cycle and the rate signal, i.e., the fraction of the clock cycle shown in FIG. 3D and the delay time designated by the pattern generator 5 shown in FIG. 3E are also identical to those of FIG. 7.

The logic delay circuit 10 delays the rate signal by two time interval of the clock signal, i.e., 10 ns through the synchronous delay circuit since the delay time for the timing edge is 14 ns. The enable signal from the logic delay circuit 10 is provided to the logic variable delay circuit 80 through the format control gate 62 and the OR gate 67. The logic delay circuit 10 produces high resolution delay data (HRDAT) shown in FIG. 3G based on the address data from the pattern generator 5.

The logic delay control circuit 70 receives the high resolution delay data showing 4 ns (difference between the delay time 14 ns and the delay time 10 ns formed by the logic delay circuit 10) which is smaller than the time interval of the clock signal. In the logic delay control circuit 70, the register 74 stores the delay time which corresponds to the skew of the signal path which is iOns in this example. Thus, the delay data indicating the delay time of 14 ns is provided to the logic variable delay circuit 80 wherein it is separated the part which is an integer multiple of the clock time period (10 ns in this example) from the fraction of the time period (4 ns in this example) which is smaller than the clock time interval.

The delay time of 10 ns is formed by the clock synchronous delay circuit in the logic variable delay circuit 80 and is applied to the pulse signal from the OR gate 67. Therefore, an enable signal having 20 ns delay is generated by the logic delay circuit 80 as shown in FIG. 3F. The enable signal opens the enable gate 11 so that the clock signal synchronized with the enable signal is generated as shown in FIG. 3H. The logic variable delay circuit 80 addresses the memory M to read out the control signal to form the high resolution delay time of 4 ns. Thus, 4 ns delay time formed by the variable delay circuit 12 which is controlled by the high resolution delay data from the logic delay circuit 80 is added to the output of the enable gate 11 as shown in FIG. 3I. The timing edge signal that applies to the RS flip-flop 50 has an overall delay time of 24 ns as shown in FIG. 3I which includes the intended timing delay 14ns and the skew adjust time 10 ns.

Figure 8:
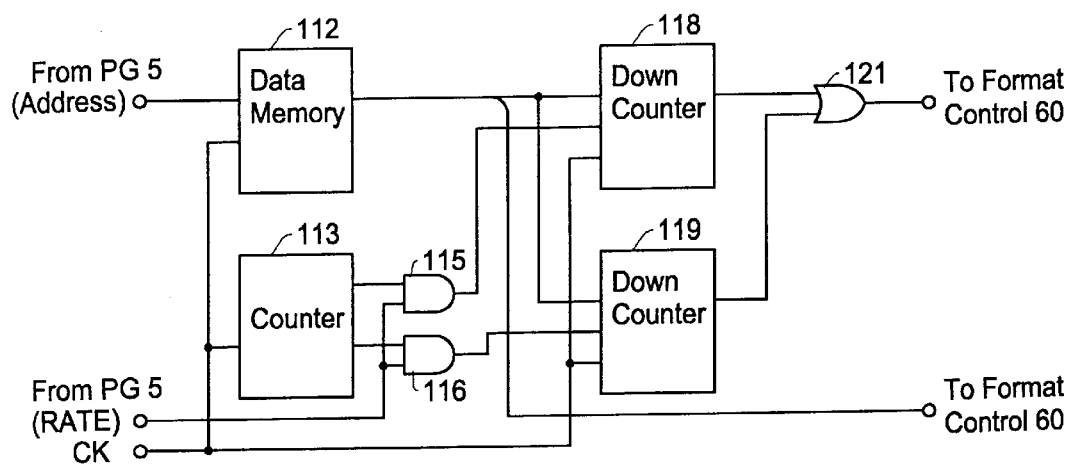
FIG. 8 is a circuit diagram showing an example of structure of the logic delay circuit 10 in the timing edge forming circuit of FIG. 1.

FIG. 8 is a circuit diagram showing an example of structure of the logic delay circuit 10 in the timing edge forming circuit of FIG. 1. For simplicity of explanation, the pattern data PADAT and its associated circuit components are omitted in FIG. 8. The address data from the pattern generator 5 accesses a data memory 112 to generate delay data therefrom. The delay data from the data memory 112 showing a delay time which is an integer multiple of the one cycle of the reference clock signal CK is provided to down counters 118 and 119. The delay data from the data memory 112 showing a delay time smaller than the one cycle of the reference clock signal CK, such as shown by lower bits of the output of the data memory 112, is provided to the format control 60 as shown in FIG. 8.

The down counter 118 and 119 count the clock signal CK based on the delay data which is an integer multiple of the one clock cycle of the clock signal CK. In this example, the down counters 118 and 119 are provided to alternately perform the counting operations. In case where an operating speed of a down counter is fast enough, only one down counter will be sufficient to carry out the delaying operation for producing the timing edges. Each of the down counters 118 and 119 counts the clock signal CK based on the data from the data memory 112 when load data from AND gates 115 and 116 through a counter 113 is "1". The down counters 118 and 119 change to a high level when the load data is "0". The outputs of the down counters 118 and 119 are provided to an OR gate 121 to supply the enable signal to the format control 60.

Figure 9:
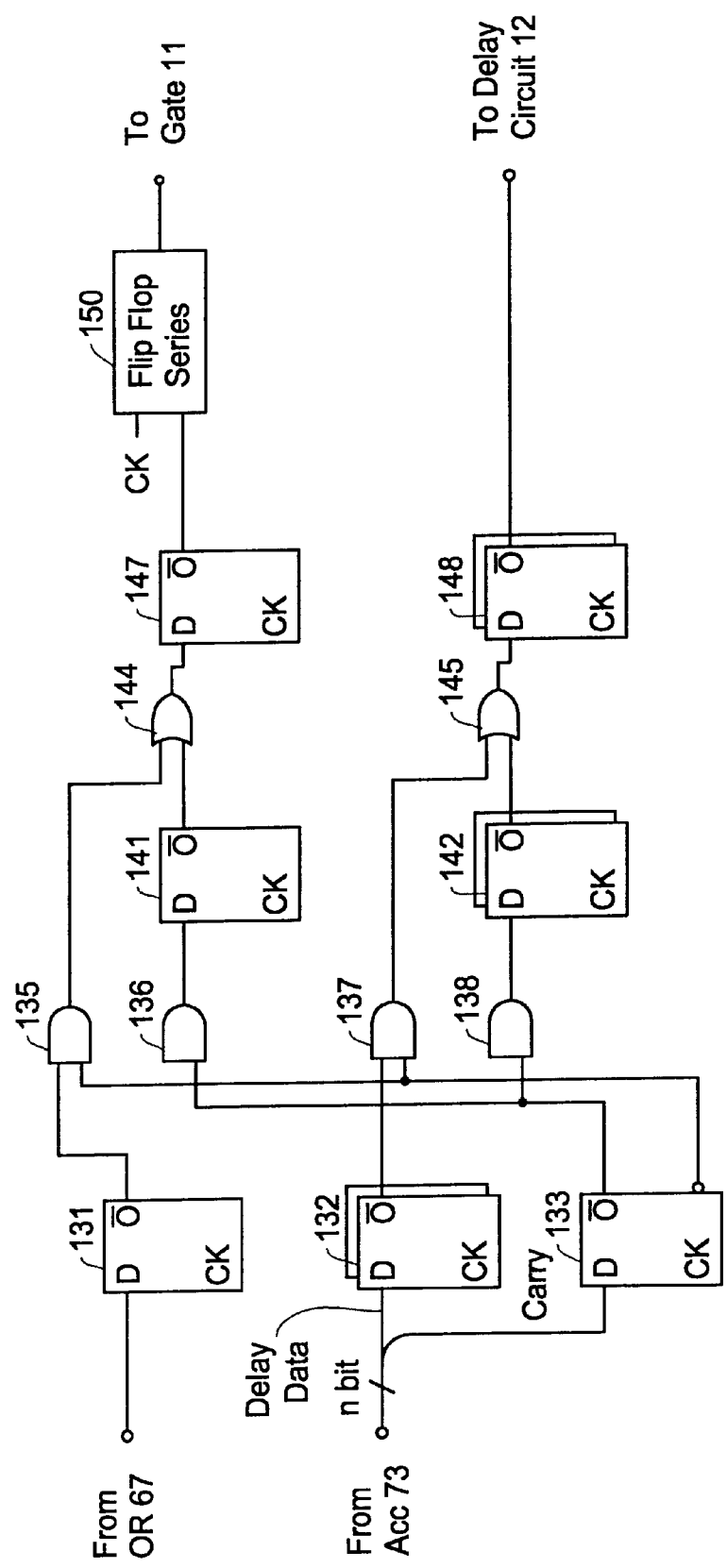
FIG. 9 is a circuit diagram showing an example of structure of the logic variable delay circuit 8 in the timing edge forming circuit of FIG. 1.

FIG. 9 is a circuit diagram showing an example of structure of the logic delay circuit 8 in the timing edge forming circuit of FIG. 1. Numerals 131–133, 141, 142, 147 and 148 indicate delay type flip-flops. A flip-flop series 150 includes a set of series connected flip-flops for producing a delay time which is an integer multiple of the one cycle of the clock signal CK. The enable signal from the OR gate 67 passes through the flip-flop 131, an AND gate 135, an OR gate 144 and the flip-flop 147 to the series flip-flop 150 where it is delayed based on the signal from the logic delay control circuit 70. The output of the flip-flop series 150 is provided to the enable gate 11 in FIGS. 1 or 2.

In the example of FIG. 9, when the delay data from the accumulator 73 includes a carry over signal, then the enable signal from the OR gate 67 and delay data (smaller than the one clock cycle) are delayed by one clock cycle. The carry over signal means that the delay time from the accumulator 73 is larger than one cycle of the clock signal CK. In such a situation, the enable signal from the OR gate 67 passes through an AND gate 136 and the flop-flop 141 wherein it is delayed by one clock cycle. Similarly, the delay data excluding the carry signal, i.e., the data smaller than one clock cycle, passes through an AND gate 138 and the flip-flop 142 wherein it is delayed by one clock cycle. The delay data is provided to the variable delay circuit 12 through an OR gate and the flip-flop 148.

Figures 10A, 10B, 10C:
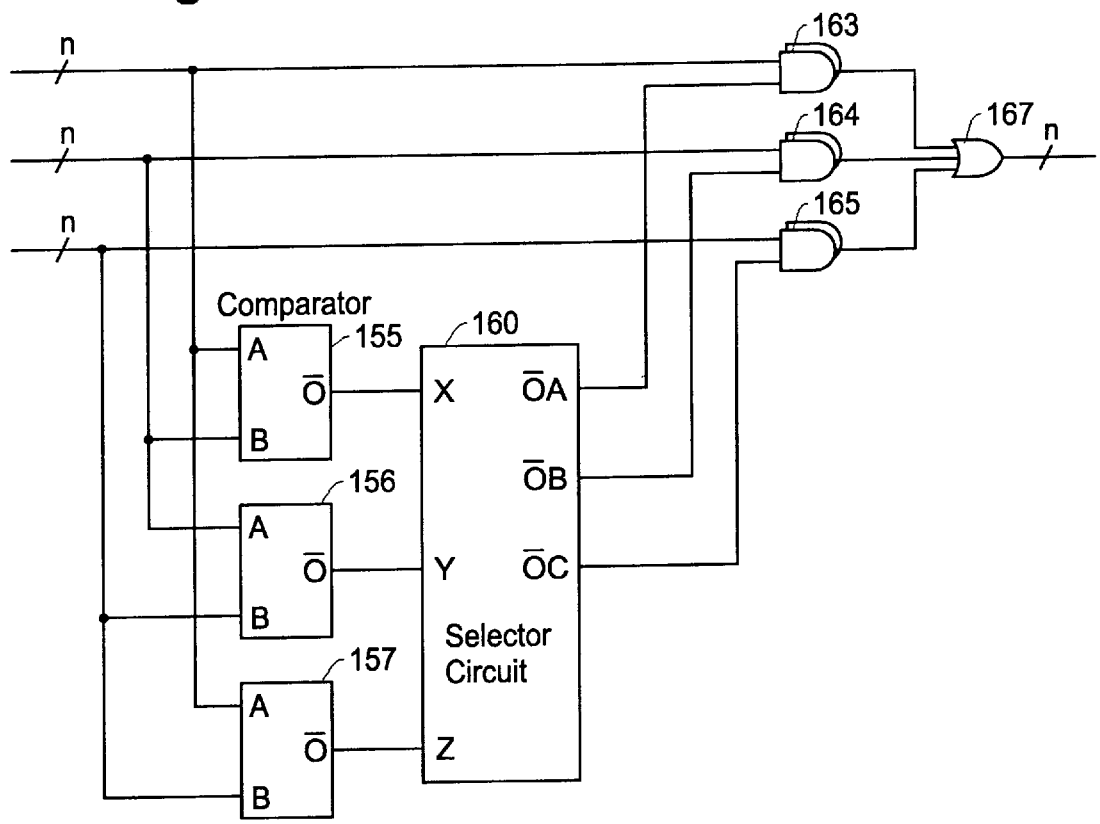
FIG. 10A is a circuit diagram showing an example of structure of the small data selector 71 in the timing edge forming circuit of FIG. 1.
FIGS. 10B and 10C are truth tables showing logical relationship in the comparator 155 and selector circuit 160 of FIG. 10A.

FIG. 10A is a circuit diagram showing an example of structure of the small data selector 71 in the timing edge forming circuit of FIG. 1. FIGS. 10B and 10C are truth tables showing logic setting the comparator 155 and selector circuit 160 of FIG. 10A. In this example, the small data selector 71 includes comparators 155–157, a selector circuit 160, AND gates 163–165 and an OR gate 167. The delay data from the logic delay circuits 10 in FIGS. 1 or 2 is compared and evaluated by the comparators 155–157 and the selector circuit 160 to determine the smallest data which passes through one of the AND gates 163–165 to be output from the OR gate 167. By the logical relationship defined in FIGS. 10B and 10C, the data indicating the smallest delay time is selected by the selector circuit of FIG. 10A.

Figure 11:
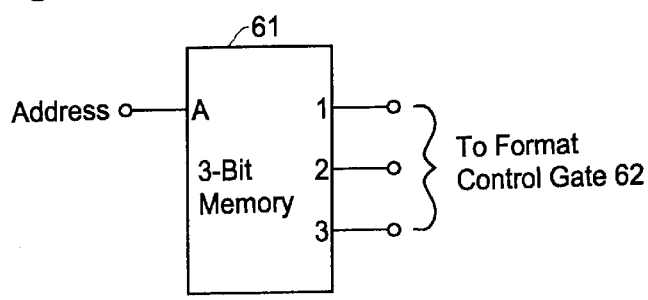
FIG. 11 is a schematic diagram showing an example of structure of the main format control 61 in the timing edge forming circuit of FIG. 1.

FIG. 11 is a schematic diagram showing an example of structure of the main format control 61 in the timing edge forming circuits of FIGS. 1 and 2. In this example, the main format control 61 is a memory which stores 3 bit data therein. By the address data from the pattern generator 5, the format control 61 outputs 3 bit signal, each bit of which is assigned to the corresponding format control gate 62 to select which timing edges should be used for the set and reset signal for the RS flip-flop 50 in FIGS. 1 and 2.

As has been described, according to the example of the present invention, the variable delay circuit needs to provide only 4 ns delay time to the pulse signal while variable delay circuit in the conventional example has to provide 14 ns delay time. This means that the high resolution delay time produced by the analog variable delay circuit utilizing signal propagation delay times has a smaller share in the timing edge forming circuit of the present invention than that in the conventional circuit. The large portion of the delay time in forming the timing edges are undertaken by the logic delay circuits wherein the delay time is formed in synchronism with the reference clock signal. The variable delay time in the timing edge forming circuit of the present invention is used to produce only a delay time smaller than the time period of one reference clock cycle.

Especially, the variable delay circuit used in the conventional timing circuit such as shown in FIG. 7 to provide a fairly large amount of delay time for adjusting the skews by an analog operation is obviated in the present invention. In the present invention, most of the delay times for adjusting the skews are produced by the logic delay circuit which is operated in synchronism with the clock signal. Further, since the large part of the variable delay circuit has been eliminated, a signal path length for propagating the timing pulses has been reduced.

Therefore, in the present invention it is possible to improve the resolution in setting the timing edges of the test signal since the delay time to be produced by the analog operation of the circuit components, i.e., the variable delay circuit is significantly reduced. Furthermore, since the signal path length has also been reduced, the timing accuracy and resolution as well as the timing stability have been improved. For example, the timing edges of the present invention is less affected by the environmental changes such as temperature variations. In addition, timing fluctuations caused for example by noise has been reduce to 20 picosecond in the present invention from 60 picosecond which is typical in the conventional circuit.

As noted above, the large portion of the variable delay circuit to be used to produce the delay time for adjusting the skew time has been eliminated in the present invention. The variable delay circuit in the present invention is used only for producing the high resolution delay time which is smaller than the time period of the one clock cycle. Since the delay time for adjusting the skew time is fairly larger than the time period of the clock signal, the variable delay circuit in the conventional timing circuit requires a large number of IC gates and selection gates. In the present invention, however, the circuit can be formed with less cost since the number of circuit components has been considerably reduced. Further, because the major portion of the timing edge forming circuits is formed with logic circuits, it has become practical to integrate the circuit into an integrated circuit such as an LSI.

What is claimed is:

1. A timing edge forming circuit for use in a semiconductor IC test system for testing an IC device by supplying test signals through a plurality of test signal paths corresponding to input pins of said IC device, said timing edge forming circuit producing a plurality of timing edges of a test signal within a test cycle for each test signal path, said timing edge forming circuit comprising:

a pattern generator for generating test pattern information to produce a test signal to be supplied to the semiconductor device wherein the test pattern information includes address data and a rate signal which is synchronizing with a clock signal;

a plurality of first logic delay circuits (10) receiving the rate signal and the address data from the pattern generator wherein a first delay time data is generated by a data memory accessed by the address data wherein the first delay time data includes a first multiple delay time which is an integer multiple of one cycle of the clock signal and a first fractional delay time which is smaller than one cycle of the clock signal, and each of the first logic delay circuit generates an enable signal in synchronism with the clock signal which is delayed by the first multiple delay time and the first fractional delay time;

a logic delay control circuit for receiving the first fractional delay time from a first logic delay circuit wherein the logic delay control circuit stores skew data for adjusting a skew which is a difference in signal propagation delay times between the signal paths and adds the first fractional delay time and the skew data to form second delay time data;

a plurality of second logic delay circuits (80) receiving the second delay time data from the logic delay control circuit wherein each of the second logic delay circuits provides a second multiple delay time in the second delay time data which is an integer multiple of one cycle of the clock signal to the enable signal to form a delayed enable signal, and produces a second fractional delay time which is smaller than one cycle of the clock signal, and each of the second logic delay circuits transmits the delayed enable signal and the second fractional delay time; and a variable delay circuits (12) for providing a high resolution delay time to the delayed enable signal based on the second fractional delay time.

2. A timing edge forming circuit as defined in claim 1, wherein said logic delay control circuit includes a data selector (71) for receiving a plurality of said first fractional delay times from said plurality of first logic delay circuits and selecting one of the data which showing the smallest value of delay time, a register (72) for storing said skew data for adjusting said skew time between said test signal paths, and a first accumulator (73) for accumulating said first fraction of delay time and said skew data to form said second delay time data.

3. A timing edge forming circuit as defined in claim 1, further comprising:
   a format control gate for sending the enable signal from the first logic delay circuit either through a gate for forming a rising edge or a gate for forming a falling edge of the test signal; and
   said timing edge forming circuit further includes a main format control which receives a format control signal, said main format control driving said control gate for selecting either one of said signal path for said rising edge or said signal path for said falling edge of said test signal.

4. A timing edge forming circuit as defined in claim 1, wherein said first logic delay circuit includes a clock synchronous delay circuit for generating said pulse signal in synchronism with said clock signal a delay time which is an integer multiple of the time interval of said clock signal.

5. A timing edge forming circuit as defined in claim 1, wherein said second logic delay circuit includes a clock synchronous delay circuit for generating said enable signal in synchronism with said clock signal a delay time which is an integer multiple of said time interval of said clock signal.

6. A timing edge forming circuit as defined in claim 1, wherein each of said second logic delay circuits (80) generates an address signal based on data showing said second fractional of delay time.

7. A timing edge forming circuit as defined in claim 1, wherein said variable delay circuit is formed with a plurality of IC gates connected in series and a selection gate to select one or more combination of said IC gates, each of said IC gates producing a delay time based on its signal propagation time.

8. A timing edge forming circuit as defined in claim 2, wherein said logic delay control circuit further includes a register (74) for storing offset time data indicating an offset time to be used for intentionally providing a timing difference between said test signal and other signals including an expected signal, and a second accumulator (75) for accumulating said offset time data and said second delay time data from said first accumulator (73).

9. A timing edge forming circuit for use in a semiconductor IC test system for testing an IC device by supplying test signals through a plurality of test signal paths corresponding to input pins of said IC device, said timing edge forming circuit producing a plurality of timing edges of a test signal within a test cycle for each test signal path, said timing edge forming circuit comprising:
   a pattern generator for generating test pattern information to produce a test signal to be supplied to the semiconductor device wherein the test pattern information includes address data, a rate signal and pattern data;
   a plurality of first logic delay circuits (10) receiving the rate signal and the address data from the pattern generator wherein a first delay time data is generated by a data memory accessed by the address data wherein the first delay time data includes a first multiple delay time which is an integer multiple of one cycle of the clock signal and a first fractional delay time which is smaller than one cycle of the clock signal, and each of the first logic delay circuit generates an enable signal in synchronism with the clock signal which is delayed by the first multiple delay time and the first fractional delay time;
   a format control gate for sending said enable signal from the first logic delay circuit either through a gate for forming a rising edge or a gate for forming a falling edge of the test signal;
   a logic delay control circuit for receiving the first fractional delay time from the first logic delay circuit wherein the logic delay control circuit stores skew data for adjusting a skew which is a difference in signal propagation delay times between the signal paths and adds the first fractional delay time and the skew data to form second delay time data;
   a plurality of second logic delay circuits (80) receiving the second delay time data from the logic delay control circuit wherein each of the second logic delay circuits provides a second multiple delay time in the second delay time data which is an integer multiple of one cycle of the clock signal to the enable signal to form a delayed enable signal, and produces a second fractional delay time which is smaller than one cycle of the clock signal, and each of the second logic delay circuits transmits the delayed enable signal and the second fractional delay time;
   a pair of enable gates (11) for receiving said delayed enable signal from said second logic delay circuit and generating a clock signal which is gated by said delayed enable signal;
   a pair of variable delay circuits (12) for providing a high resolution delay time based on said second fractional delay time from corresponding one of said second logic delay circuit to said gated clock signal from said enable gate to form either a set pulse or a reset pulse; and
   a set-reset flip-flop (50) having a set terminal and reset terminal, said set terminal being provided with said set pulse and said reset terminal being provided with said reset pulse from said variable delay circuits.

\* \* \* \* \*